(12) United States Patent
Roberds et al.

(10) Patent No.: US 6,638,835 B2
(45) Date of Patent: Oct. 28, 2003

(54) METHOD FOR BONDING AND DEBONDING FILMS USING A HIGH-TEMPERATURE POLYMER

(75) Inventors: Brian Roberds, Escondido, CA (US); Cindy Colinge, Carmichael, CA (US); Brian Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 36 days.

(21) Appl. No.: 10/015,107

(22) Filed: Dec. 11, 2001

(65) Prior Publication Data

US 2003/0108715 A1 Jun. 12, 2003

(51) Int. Cl.[7] ............................................. H01L 21/461
(52) U.S. Cl. ........................ 438/458; 438/459; 438/977
(58) Field of Search ................................. 438/455, 458, 438/459, 977

(56) References Cited

U.S. PATENT DOCUMENTS

| | | | | |
|---|---|---|---|---|
| 6,100,166 A | * | 8/2000 | Sakaguchi et al. | 438/455 |
| 6,136,171 A | * | 10/2000 | Frazier et al. | 204/450 |
| 6,146,979 A | * | 11/2000 | Henley et al. | 438/458 |
| 6,323,108 B1 | * | 11/2001 | Kub et al. | 438/458 |
| 6,413,874 B1 | * | 7/2002 | Sato | 438/714 |
| 6,429,104 B1 | * | 8/2002 | Auberton-Herve | 438/527 |
| 6,486,008 B1 | * | 11/2002 | Lee | 438/149 |
| 6,563,133 B1 | * | 5/2003 | Tong | 257/52 |

* cited by examiner

*Primary Examiner*—Carl Whitehead, Jr.
*Assistant Examiner*—Stephen W. Smoot
(74) *Attorney, Agent, or Firm*—Blakely, Sokoloff, Taylor & Zafman LLP

(57) ABSTRACT

The invention relates to a semiconductor structure that is formed by delaminating a semiconductor substrate and by bonding the top section of the substrate to a transfer substrate. Delaminating is carried out by causing a polymer film to achieve greater adhesion that an embrittlement layer in the semiconductor substrate.

16 Claims, 6 Drawing Sheets

US 6,638,835 B2

METHOD FOR BONDING AND DEBONDING FILMS USING A HIGH-TEMPERATURE POLYMER

FIELD OF THE INVENTION

An embodiment of the present invention relates generally to integrated circuit fabrication. More particularly, an embodiment of the present invention relates to debonding a thin semiconductor layer and bonding it to a transfer substrate.

BACKGROUND OF THE INVENTION

Description of Related Art

Thin semiconductor layers (sometimes referred to as epitaxial (EPI) wafers) are used to control the detrimental effects of resistance-capacitance (RC) that occur in semiconductor devices. One challenge with thin semiconductor layers is their high cost. To that end, one solution has been to debond a semiconductive layer from its formerly integral substrate and to bond it to another substrate that provides an RC advantage over the prior art. A high-cost, and high yield-loss disadvantage is the processing needed to get a smooth enough surface from the debonded semiconductive layer to allow for efficient bonding to another semiconductive structure.

BRIEF DESCRIPTION OF THE DRAWINGS

In order to more clearly depict the manner in which embodiments of the present invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

Figure 1:
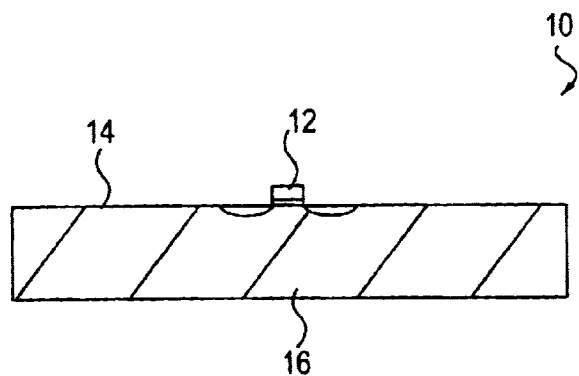
FIG. 1 is an elevational cross-section of a semiconductor structure that reveals process integration that is near back-end-of-line (BEOL) according to an embodiment.

The present invention relates to a process of forming a substrate such as a semiconductor substrate. In a general embodiment, an active layer of a substrate is fractured away from the substrate by adhesion to a polymer film. A stiffener, that is disposed over the active layer, prevents the active layer from shattering.

Polymers

The polymer material is preferably a material that will withstand medium-range processing temperatures such as from about 100° C. to about 450° C. Additionally, the polymer material has a low moisture or volatile-matter content such that temperature cycling through this medium range causes the polymer material to emit insufficient amounts of gas that would otherwise delaminate the polymer film from the stiffener.

In one embodiment, the polymer has a glass transition temperature above about 300° C. to about 450° C. The upper limit is determined by the thermal stability of the polymer. The polymer may be applied by a spin-bake-cure processing technique known in the art. The polymer may also have a minimal out-gassing behavior during thermal processing.

Various polymers may be selected. One group of polymers includes arylene ether polymers, such as poly(arylene ether) (PAE), poly(arylene ether ether ketone) (PAEEK), poly(arylene ether ether acetylene) (PAEEA), poly(arylene ether ether acetylene ether ether ketone) (PAEEAEEK), poly(arylene ether ether acetylene ketone) (PAEEAK), and poly(naphthylene ether) (PNE). Such polymers include but are not limited to homopolymers, block or random copolymers, graft copolymers, polymer blends, interpenetrating polymer networks (IPNs), and semi-interpenetrating polymer networks (SIPNs).

The polymers are dissolved in a solvent according to known technique. Various solvents are known in the art. For example, solvents have been used for photoresist materials and for organic interlayer dielectric (ILD) materials. Solvents include alcohols, ketones, ethers, and combinations thereof. Examples of alcoholic solvents include methanol, ethanol, propanol, isopropanol, butanol, methyl cellosolve, cellosolve, butyl cellosolve, and the like. Examples of ketone solvents include methyl ethyl ketone, methyl isobutyl ketone, cyclopentanone, cyclohexanone, cycloheptanone, cyclooctanone, γ-butyrolactone, N-methylpyrrolidinone, N-cyclohexylpyrrolidinone and N,N-dimethylacetamide. Examples of ether solvents include aliphatic, aromatic, and aromatic aliphatic ethers. Examples of ethers include methyl ether, ethyl ether, n-propyl ether, isopropyl ether, n-butyl ether, vinyl ether, allyl ether, anisole, methyl anisole, phenetole (ethyl phenyl ether), phenyl ether, 1,4-dioxane, tetrahydrofuran, isopropyl phenyl ether, and the like.

Because an embodiment of the present invention contemplates use of the polymers at temperatures in the range around 400° C., ethers with higher boiling points may be selected. Examples thereof include, but are not limited to n-butyl ether (B.p. 142° C.), anisole (B.p. 154° C.), phenetole (B.p. 172° C.), phenyl ether (B.p. 259° C.), 1,4 dioxane (B.p. 101° C.), and the like.

Processing

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations.

In order to show the structures of embodiments of the present invention most clearly, the drawings included herein are diagrammatic representations of integrated circuit structures. Thus, the actual appearance of the fabricated structures, for example in a photomicrograph, may appear different while still incorporating the essential structures of embodiments of the present invention. Moreover, the drawings show only the structures necessary to understand embodiments of the present invention. Additional structures known in the art have not been included to maintain the clarity of the drawings.

FIG. 1 is an elevational cross-section of a semiconductor structure 10 during processing. According to an embodiment, front-end-of-line (FEOL) processing is substantially completed, and metallization and other back-end-of-line (BEOL) processing has not been initiated. A gate 12 is represented as being disposed upon an upper surface 14 of a first substrate 16. First substrate 16 may be understood to be a singulated die from a wafer, or it may be an unsingulated section of a wafer.

Figure 2:
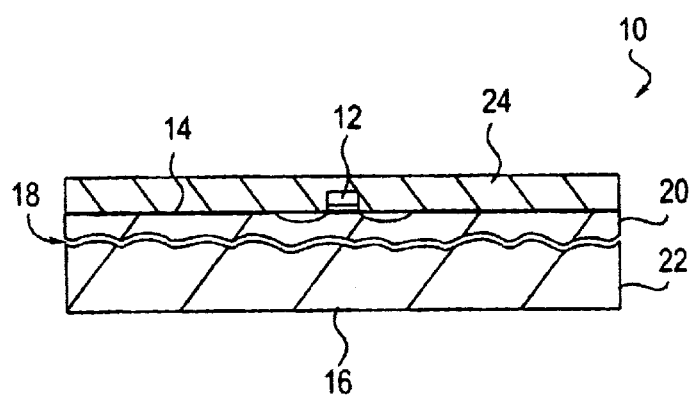
FIG. 2 is an elevational cross-section of the semiconductor structure depicted in FIG. 1 after formation of an embrittlement zone.

FIG. 2 illustrates further processing, wherein first substrate 16 has been ion implanted to a certain depth below upper surface 14 to form an embrittlement zone 18. Embrittlement zone 18 may be formed by one of several techniques, such as SMARTCUT® by Soitec USA, Inc. of Peabody, Mass., or the cleaving process of Silicon Genesis Corporation of Campbell, Calif., or the ELTRAN® (Epitaxial Layer TRANsfer) process of Canon, USA, Santa Clara, Calif.

The formation of embrittlement zone 18 acts to further define first substrate 16 into a top section 20 and a bottom section 22. Top section 20 may also be referred to as a first active substrate 20. Embrittlement zone 18 is processed under conditions that it will not cause bottom section 22 to delaminate until subsequent processing. After the formation of embrittlement zone 18, further processing is carried out. A stiffener 24 is formed over upper surface 14 in a manner that engulfs gate 12 without causing detrimental change thereto. In one embodiment, stiffener 24 is formed by chemical vapor deposition (CVD) such as the decomposition of tetra ethyl ortho silicate (TEOS) under processing conditions that do not exceed about 200° C. Other processes may be selected, but it is preferable to form stiffener 24 at as low as temperature as feasible, or at least low enough to prevent premature delamination of bottom section 22. It is noted that gate 12 extends into stiffener 24.

Figure 3:
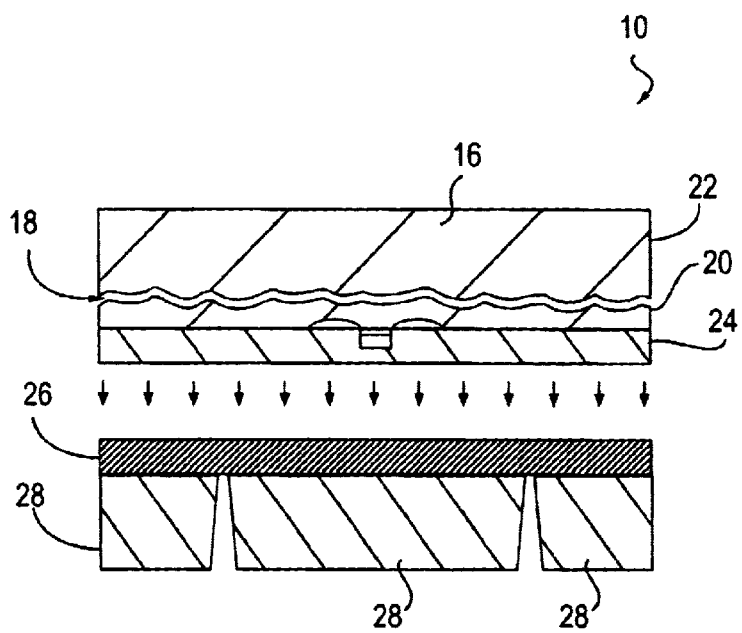
FIG. 3 is an elevational cross-section of the semiconductor structure depicted in FIG. 2 after further processing.

FIG. 3 illustrates further processing. As noted by the new orientation of gate 12 first substrate 16 has been inverted (for illustrative purposes) with respect to FIGS. 1 and 2. A polymer film 26 is formed on a second substrate 28. As set forth herein, polymer film 26 is formed according to processing parameters in this disclosure, and according to known technique. FIG. 3 represents the bonding of stiffener 24 with polymer film 26 as they are joined. In one embodiment, stiffener 24 has a thickness in a range from about 0.5 microns to about 10 microns. In another embodiment, stiffener 24 has a thickness in a range from about 1 micron to about 4 microns. In one embodiment, polymer film 26 has a thickness in a range from about 200 nm to about 1,000 nm. In another embodiment, polymer film 26 has a thickness in a range from about 360 nm to about 750 nm.

It is noted that second substrate 28 has a plurality of back-side recesses 30 that are provided for optional subsequent removal of polymer film 26 as set forth herein. During further processing while polymer film 26 and embrittlement zone 18 are contemporary structures, a first delamination stress exists in embrittlement zone 18, that during thermal processing up to about 450° C., is greater that a second delamination stress that exists within the area of polymer film 26 disposed between second substrate 28 and stiffener 24.

Figure 4:
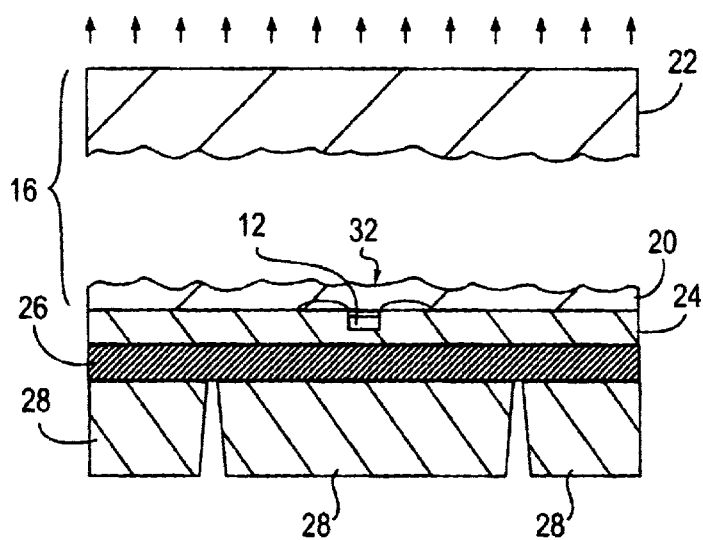
FIG. 4 is an elevational cross-section of the semiconductor structure depicted in FIG. 3 after further processing.

As depicted in FIG. 4, second substrate 28 is bonded with first substrate 16 by the adhesive quality of polymer film 26 to stiffener 24. Stiffener 24 is typically not planarized by any process prior to the bonding of second substrate 28 to first substrate 16. Accordingly, stiffener 24 may have a surface roughness that is greater than the minimum that was previous required where two oxide layers were bonded. In one embodiment, stiffener 24 has microsurface roughness that is greater than or equal to about 10 nm. In one embodiment, stiffener 24 has a microsurface roughness that is greater than or equal to about prime grade polish as is quantitatively understood in the art. Accordingly, processing is expedited where no previous surface preparation of stiffener 24 is required. Further processing is carried out where semiconductor structure 10 is heated under conditions to cause stress in embrittlement zone 18 to increase until bottom section 22 delaminates from top section 20. Heating is carried out to a temperature between room temperature and about 450° C. In one embodiment, heating is carried out in a temperature range from about 200° C. to about 400° C.

The presence of polymer film 26 has at least two qualities. First, because polymer film 26 has adhesive strength during heating that surpasses the adhesive attraction between top section 20 of first substrate 16 and bottom section 22. Second, because polymer film 26 is soft, it flows into the rough topology of stiffener 24; no planarizing of stiffener 24 is required. On the other hand, stiffener 24 is provided for various reasons. Because polymer film 16 is soft relative to top section 20 of first substrate 16, and because top section 20 may be extremely brittle, stiffener 24 acts to prevent top section 20 from shattering during the delamination of bottom section 22. Additionally, stiffener 24 acts as a BEOL interlayer dielectric layer during metallization and other processing.

As depicted in FIG. 4, bottom section 22 has delaminated from the rest of semiconductor structure 10 and a fracture surface 32 of top section 20 is exposed. In one embodiment, top section 20 has a thickness in a range from about 200 nm to about 800 nm. In another embodiment, top section 20 has a thickness in a range from about 300 nm to about 500 nm. In another embodiment, top section 20 has a thickness of about 360 nm.

In another embodiment, it is noted that the semiconductor structure depicted in FIG. 4 comprises a novel silicon-on-polymer (SOP) insulated device. Where polymer film 26 has sufficient dielectric properties, it may act as an isolation dielectric. One such polymer is FLARE® made by Allied-Signal Inc. of Morristown, N.J.

Figure 5:
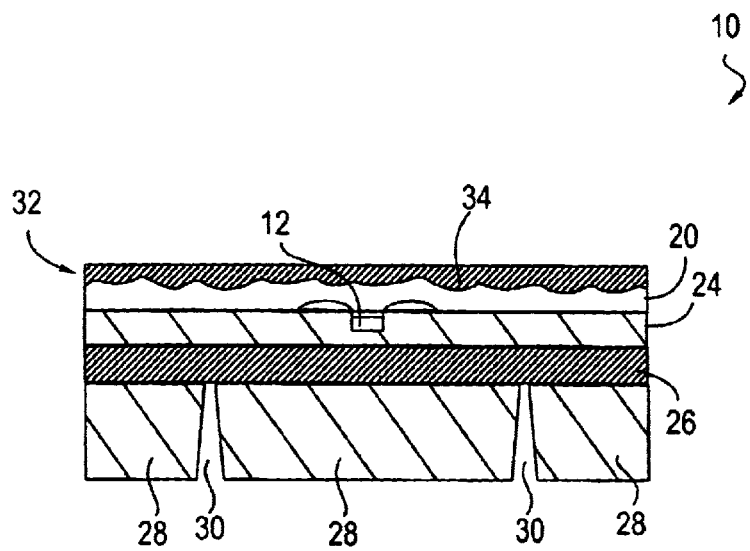
FIG. 5 is an elevational cross-section of the semiconductor structure depicted in FIG. 4 after further processing.

Semiconductor structure 10 is depicted in FIG. 5, after further processing. After the delamination of bottom section 22 (FIG. 4), top section 20, as the remnant of first substrate 16 (FIGS. 1–4), has a first dielectric layer 34 formed on the fracture surface 32 of top section 20. In one embodiment, first dielectric layer 34 is an oxide such as a thermal oxide or a CVD oxide. In one embodiment, first dielectric layer 34 is a nitride such as a thermal nitride or a CVD nitride. In one embodiment, first dielectric layer 34 is a carbide such as a CVD carbide. In one embodiment, first dielectric layer 34 is a carbon-doped oxide (CDO) such as a carbon-doped (implanted) thermal oxide or a CVD CDO. Additionally, combinations thereof may be used.

In one embodiment, first dielectric layer 34 is formed by CVD at a temperature below the glass transition temperature of polymer film 26. CVD processing is also carried out under conditions that act to form as smooth a surface of first dielectric layer 34 as possible. In one embodiment, first dielectric layer 34 is made of silica, $SiO_2$, that is formed by CVD in a temperature range from about 100° C. to about 200° C. Other oxides may be used for first dielectric layer 34 including oxides such as alumina, ceria, thoria, zirconia, hafnia, titania, and combinations thereof. Nitrides may be made such as aluminum nitride, cerium nitride, thorium nitride, zirconium nitride, hafnium nitride, titanium nitride, and combinations thereof.

In one alternative embodiment, a planarization process flow is followed to smooth first oxide layer 34. Planarization may be done by mechanical polishing (MP), chemical etchback, chemical-mechanical polishing (CMP), and combinations thereof.

Figure 6:
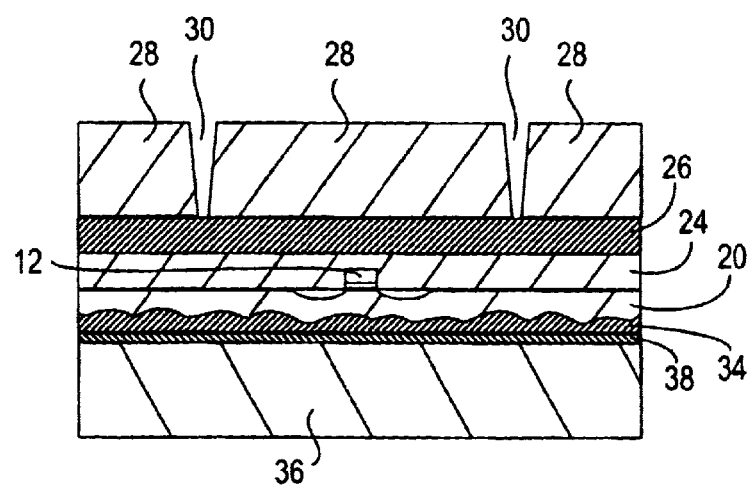
FIG. 6 is an elevational cross-section of the semiconductor structure depicted in FIG. 5 after further processing.

FIG. 6 illustrates further processing. After the formation of first dielectric layer 34, semiconductor structure 10 is inverted (for illustrative purposes), and a third substrate 36 with a third substrate dielectric layer 38 is brought into contact with first dielectric layer 34. In one embodiment, third substrate dielectric layer 38 is an oxide such as a thermal oxide or a CVD oxide. In one embodiment, third substrate dielectric layer 38 is a nitride such as a thermal nitride or a CVD nitride. In one embodiment, third substrate dielectric layer 38 is a carbide such as a CVD carbide. In one embodiment, third substrate dielectric layer 38 is a carbon-doped oxide (CDO) such as a carbon-doped (implanted) thermal oxide or a CVD CDO. Additionally, combinations thereof may be used.

Third substrate may be referred to herein as the final transfer substrate or simply the transfer substrate. In one embodiment, third substrate dielectric layer 38 and first dielectric layer 34 are substantially identical to each other. By "substantially identical", it is understood that the two dielectric layers may be made by the same process such as CVD or thermal growth. Similarly, the two dielectric layers may be made of the same dielectric compound. Similarly, the two dielectric layers may vary from each other in composition and texture under ordinary process parameter fluctuations, or they may vary from each other due to the substrate onto which they are deposited. Similarly, first dielectric layer 34 and third substrate dielectric layer 38 may be formed by a thermal dielectric growth, CVD, and a combination thereof.

The bond between first dielectric layer 34 and third substrate dielectric layer 38 typically forms at room temperature, wherein ordinary hydrogen bonding between the dielectric surfaces occurs. Processing may be done to strengthen the bond, including heating the semiconductor structure 10 up to about 450° C. In one embodiment, the two dielectric layers are oxides. During such heating (and during subsequent BEOL heating if any), the hydrogen bonds between first dielectric layer 34 and third substrate dielectric layer 38 are gradually replaced by oxide bonds, for example $SiO_2$ bonds.

Figure 7:
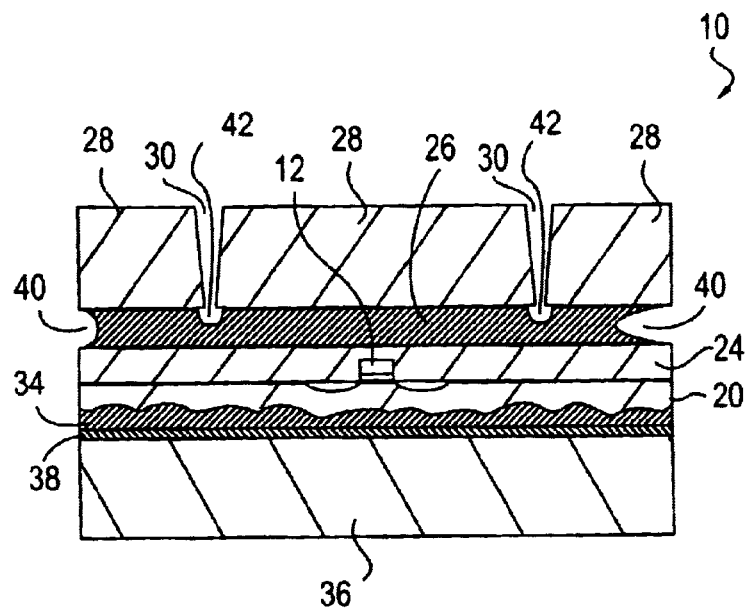
FIG. 7 is an elevational cross-section of the semiconductor structure depicted in FIG. 6 after further processing.

After the formation of the composite depicted in FIG. 6, further processing is carried out to delaminate second substrate 28 at polymer film 26. Processing is carried out to attenuate the strength of polymer film 26. FIG. 7 illustrates this process flow. In one embodiment, a wet etch is carried out that dissolves polymer film 26. In another embodiment, an oxygen plasma etch is carried out. In one embodiment, lateral access etching is done that begins to form lateral recesses 40 that attenuate polymer film 26. In another embodiment, backside-access recesses 42 begin to form that attenuate polymer film. It should be understood by one of ordinary skill in the art that a combination of etches may be carried out with a combination of accesses to polymer film 26. In another embodiment, polymer film 26 is heated to its decomposition point, while the bond between first oxide layer 34 and third substrate oxide layer 38 continues to strengthen. Such processing may be in the temperature range from about 200° C. to about 800° C. or higher.

Figure 8:
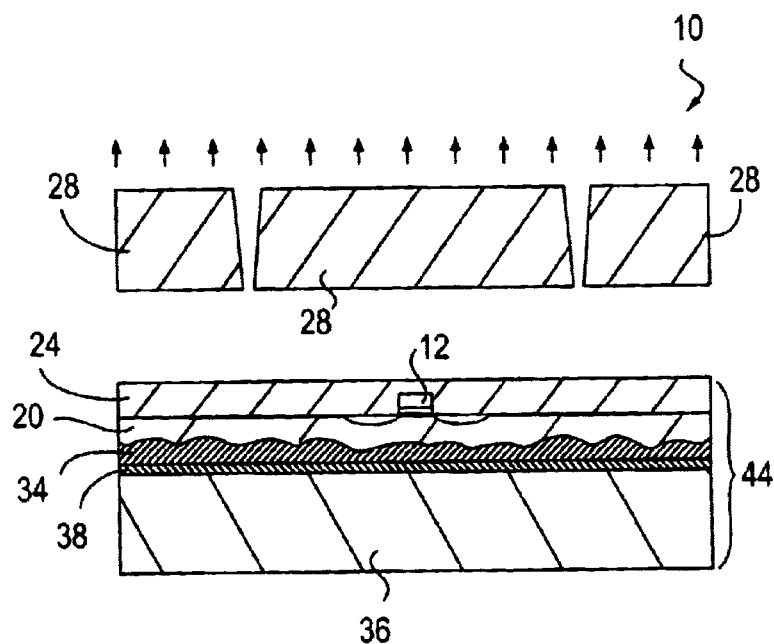
FIG. 8 is an elevational cross-section of the semiconductor structure depicted in FIG. 7 after further processing.

After sufficient attenuation of polymer film 26, second substrate 28 delaminates and stiffener 24 is exposed as depicted in FIG. 8. Thereafter, further BEOL processing such as metallization may be done.

The following is a process experiment. Reference may be made to FIGS. 1–8. A 200-mm silicon wafer was implanted with hydrogen ions at a dose of about $5 \times 10^{16}$ $cm^{-2}$ and an energy of about 30 keV through a 100-nm, thermally grown silicon oxide layer (not pictured). Layers of plasma-enhanced TEOS were deposited as the stiffener 24 on the wafer 16 at a temperature of about 350° C. The thickness of the TEOS layers that made up stiffener 24 ranged from about one to about five microns. A separate silicon wafer (the so-called handle wafer), as a second substrate 28 were coated with a PAE spin-on polymer. The polymer thickness ranged from about 400 nm to about 750 nm. The implanted wafer was cleaned in SC1 (ammonium hydroxide:peroxide:deionized water 1:1:5) at about 75° C., rinsed in deionized water, and bonded to second substrate 28 at room temperature. The bonded semiconductor structure 10 was annealed in an oven at about 300° C. for about 30 minutes to strengthen the bonding, and then at about 400° C. for about one hour to fracture the implanted first substrate 16 along embrittlement zone 18. A scanning electron microscope (SEM) analysis indicated a top section 20 of about 360 nm thick disposed against an about 1 micron-thick stiffener 24, in turn disposed against the polymer film 26, which similarly is disposed on second substrate 28. After debonding along embrittlement zone 18, dissolution was carried out through back-side recesses 30. Back-side recesses were set on a 2 mm square pitch.

In a second experiment, all conditions of the first experiment were repeated with the variation that stiffener was about 4 microns thick.

The following is a process example according to an embodiment. Reference may be made to FIGS. 1–8. A 200-mm first substrate 16 is provided with process integration (represented by gate 12) disposed upon upper surface 14. Ion implantation is carried out according to known technique until an embrittlement zone 18 has been formed that defines the top section 20 and the bottom section 22 of first substrate 16.

After the formation of embrittlement zone 18 a CVD process is carried out during which TEOS is decomposed at a temperature of about 200° C. to form stiffener 24. Stiffener has a microsurface roughness greater than or equal to about 10 nm. Processing continues by providing a second substrate 28. A polymer film 26 is formed on second substrate 28. The polymer that is selected is applied by a spin-bake-cure processing technique known in the art. The arylene ether, PAE is dissolved in an aliphatic aromatic ether solvent and spun onto second substrate 28. A spin-on process is carried out by depositing the PAE-solvent solution as a fluid in a puddle prime onto second substrate 28 for a period of from about 5 to 25 seconds and rotating second substrate 28 in a rotational range from about 300 revolutions per minute (rpm) to about 6000 rpm and for a time range from about 5 seconds to about 20 seconds. Polymer film 26 is then cured according to known technique.

After the formation of polymer film 26 on second substrate 28, polymer film 26 and stiffener 24 are joined by pressing and optional thermal cycling that causes polymer film 26 to adhere thereto. Thermal processing continues by elevating the temperature within embrittlement zone 18 until the delamination stress causes bottom section 22 to spall off.

Thereafter, a first dielectric layer 34 is formed by CVD of TEOS onto the fracture surface 32 of top section 20. First dielectric layer 34 is optionally planarized by CMP until it has a roughness that is about less than or about equal to prime grade polish as is known in the art. A third substrate 36 is prepared with an $SiO_2$ layer that is substantially identical material to first oxide layer 34. Thereafter, first dielectric layer 34 and the third substrate dielectric layer 38 are joined.

An oxygen plasma etch is next followed that attenuates polymer film 26. Access to polymer film 26 is achieved to form a lateral recess 40 until second substrate 28 delaminates.

In another process example, all processing is the same as in the first example with the difference that backside-recess 30 etching 42 is carried out. In a third process example, all processing is the same as in the first example with the addition of backside-recess 30 etching 42.

Figure 9:
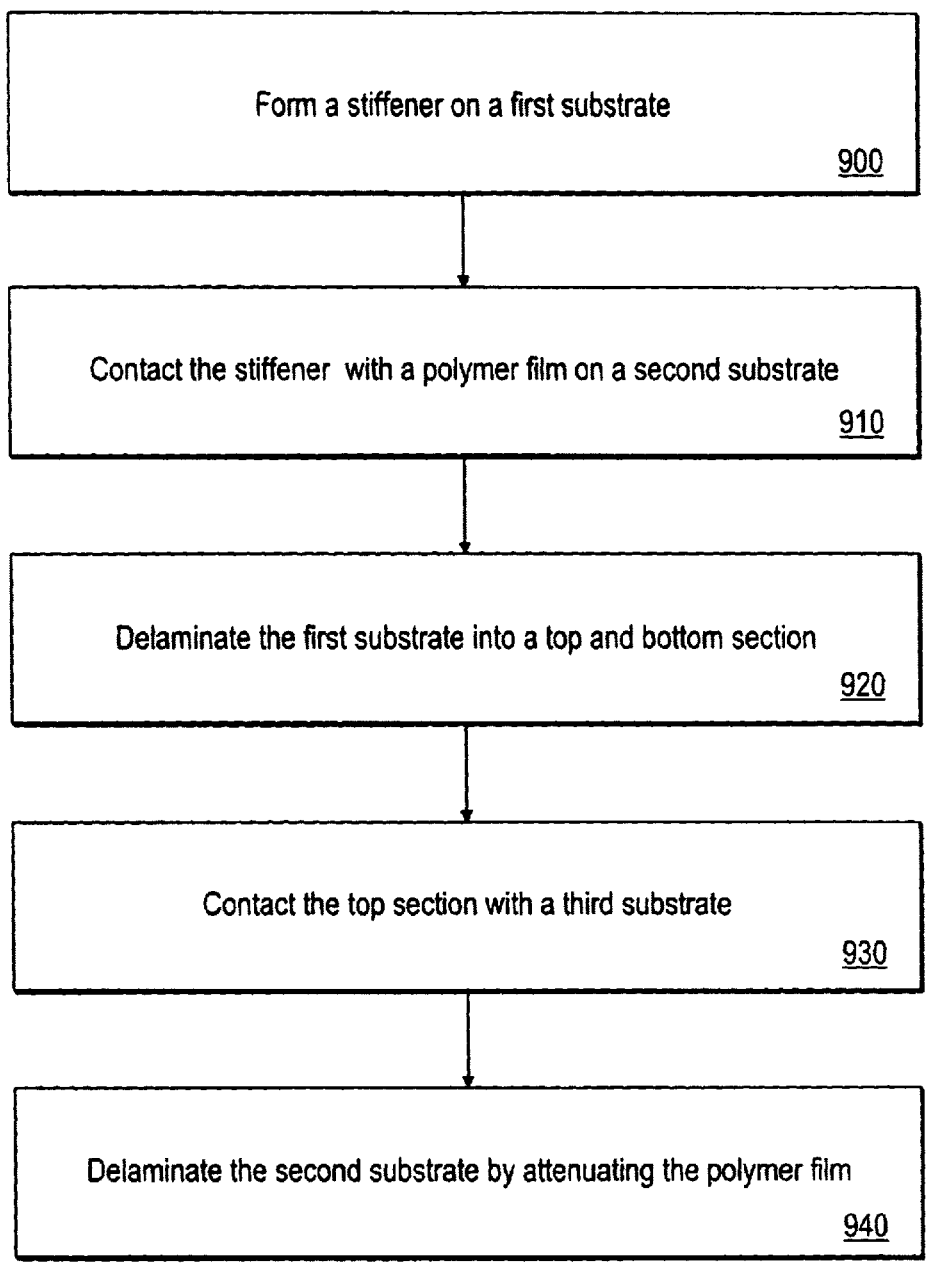
FIG. 9 is a chart that describes a process flow embodiment.

FIG. 9 illustrates a process embodiment of the present invention. According to an embodiment, a stiffener is formed 900 upon a first substrate that includes a top section and a bottom section delineated by an embrittlement zone. Next, the stiffener is contacted 910 with a polymer film that is disposed upon a second substrate. After contacting the polymer film against the stiffener, the bottom section is delaminated 920. A third substrate is brought into contact 930 with the top section of the first substrate, and the polymer film is attenuated. After sufficient attenuation, the second substrate delaminates 940.

In one embodiment, it is understood that first substrate 16, after bottom section 22 has delaminated, is likely able to sustain a new process flow that creates a new embrittlement zone and a new top- and bottom section that can be debonded as set forth herein. In this way, first substrate 16 may be used through several cycles as a "universal" first substrate.

Figure 10:
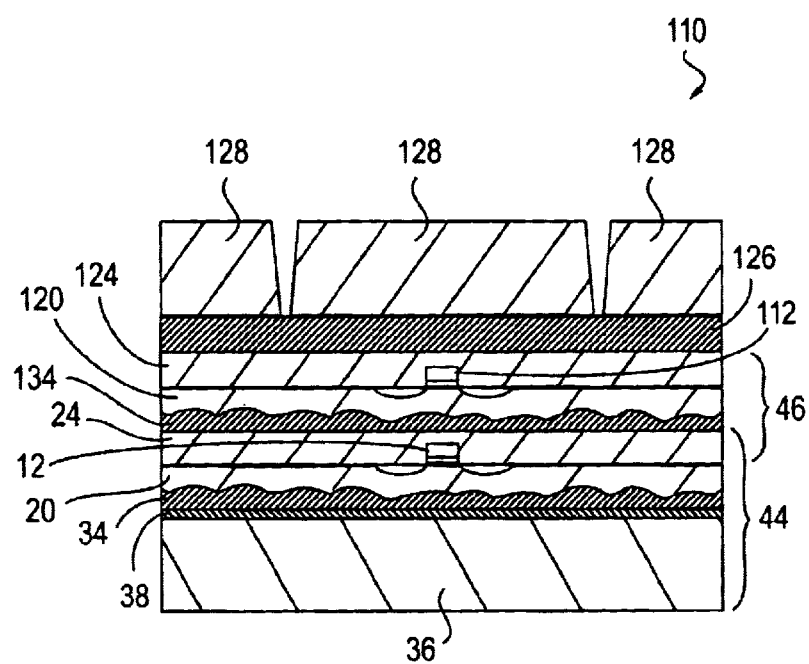
FIG. 10 is an elevational cross-section of a multi-layer semiconductor structure according to an embodiment.

In another embodiment, the process of building a multi-level microelectronic device is carried out as depicted in part in FIG. 10. With reference to FIG. 8, it is noted that stiffener 24, when freed from second substrate 28, is a dielectric surface that may be characterized as a similar dielectric surface as third substrate dielectric layer 38 as seen in FIG. 6. Accordingly the bonded, bottom silicon-film device 44, depicted in FIG. 10 is an analogous structure to third substrate 36 and third substrate dielectric layer 38 prior to the reception of a structure such as that depicted in FIG. 5.

According to this embodiment, a multi-level semiconductor structure 110 is being processed that includes the bonded, bottom silicon-film device 44 and a bonded, upper silicon-film device 46. Accordingly, it is understood that bonded, upper silicon-film device 46 may have more than one similar device disposed below it. Structures are similar in bonded, upper silicon-film device 46 including an upper section 120, a stiffener 124, a polymer film 126, a first oxide layer 134, etc.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:

forming a stiffener upon a first substrate, wherein the first substrate includes a top section and a bottom section, wherein the stiffener is disposed against the top section;

containing the stiffener with a polymer film that is disposed upon a second substrate;

delaminating the bottom section;

contacting the top section with a third substrate; and delaminating the second substrate.

2. A process comprising:

forming a stiffener upon a first substrate, wherein the first substrate includes a top section and a bottom section, wherein the stiffener is disposed against the top section;

containing the stiffener with a polymer film that is disposed upon a second substrate;

delaminating the bottom section;

contacting the top section with a third substrate; and delaminating the second substrate, wherein delaminating the second substrate includes attenuating the polymer film, selected from back-side access through the second substrate and lateral access between the second substrate and the third substrate, and the combination thereof.

3. A process comprising:

forming a stiffener upon a first substrate, wherein the first substrate includes a top section and a bottom section. wherein the stiffener is disposed against the top section;

containing the stiffener with a polymer film that is disposed upon a second substrate;

delaminating the bottom section wherein delaminating the bottom section exposes a fracture surface, further including:

forming a first dielectric layer upon the fracture surface;

contacting the fracture surface with a dielectric layer on a third substrate; and delaminating the second substrate.

4. A process comprising:

forming a stiffener upon a first substrate, wherein the first substrate includes a top section and a bottom section, wherein the stiffener is disposed against the top section;

containing the stiffener with a polymer film that is disposed upon a second substrate;

delaminating the bottom section wherein delaminating the bottom section exposes a fracture surface, further including:

forming a first dielectric layer upon the fracture surface;

contacting the top section underside with a dielectric layer on a third substrate; and delaminating the second substrate, wherein delaminating the second substrate includes attenuating the polymer film, selected from back-side access through the second substrate and lateral access between the second substrate and the third substrate, and the combination thereof.

5. A process of forming a bonded epitaxial film device comprising:

forming an active device upon a top section of a first substrate;

forming a stiffener upon the top section of the first substrate, wherein the first substrate includes a bottom section;

contacting the stiffener with a polymer film that is disposed upon a second substrate;

delaminating the bottom section from the top section along a fracture surface;

forming a first dielectric layer upon the fracture surface;

contacting the first dielectric layer with a dielectric layer on a third substrate; and delaminating the second substrate.

6. The process according to claim 5, after forming an active device and before forming a stiffener, further including:

defining the top section from the bottom section by forming an embrittlement zone therebetween.

7. The process according to claim 5, after forming an active device and before forming a stiffener, further including:

implanting ions into the substrate to form an embrittlement zone and thereby defining the top section from the bottom section.

8. The process according to claim 5, before contacting the stiffener with a polymer film, further including:

forming a polymer film on the second substrate, wherein the polymer film is selected from poly(arylene ether) (PAE), poly(arylene ether ether ketone) (PAEEK), poly(arylene ether ether acetylene) (PAEEA), poly(arylene ether ether acetylene ether ether ketone) (PAEEAEEK), poly(arylene ether ether acetylene ketone) (PAEEAK), poly(naphthylene ether) (PNE), and combinations thereof.

9. The process according to claim 5, before contacting the stiffener with a polymer film, further including:

forming a polymer film on the second substrate, wherein the polymer film is selected from homopolymers, block copolymers, graft copolymer, polymer blends, interpenetrating polymer networks (IPNs), and semi-interpenetrating polymer networks (SIPNs), wherein forming a polymer film includes dissolving the polymer in a solvent selected from the alcohols, ketones, ethers, and combinations thereof.

10. The process according to claims 5, wherein forming a stiffener includes:

depositing an oxide on the top section of the first substrate, wherein the stiffener has a roughness greater than or equal to prime grade polish.

11. The process according to claim 5, wherein delaminating the bottom section from the top section includes:

heating under conditions to cause a first delamination stress in the embrittlement zone, wherein the first delamination stress is greater than a second delamination stress that exists between the polymer film and the stiffener.

12. The process according to claim 5, wherein forming a first oxide layer upon the fracture surface includes:

forming a first dielectric layer on the fracture surface by a process selected from thermal oxide growth, thermal nitride growth, thermal carbide growth, thermal oxide growth followed by carbon doping, oxide chemical vapor deposition, nitride chemical vapor deposition, carbide chemical vapor deposition, carbon-doped oxide chemical vapor deposition, and combinations thereof.

13. The process according to claim 5, before contacting the fracture surface with a dielectric layer on a third substrate further including:

forming the dielectric layer on the third substrate, by a process selected from thermal oxide growth, thermal nitride growth, thermal carbide growth, thermal oxide growth followed by carbon doping, oxide chemical vapor deposition, nitride chemical vapor deposition, carbide chemical vapor deposition, carbon-doped oxide chemical vapor deposition, and combinations thereof.

14. The process according to claim 5, before contacting the fracture surface with a dielectric layer on a third substrate further including:

forming the oxide layer on the third substrate, wherein the dielectric layer on the third substrate and the first dielectric layer are substantially identical oxides selected from silica, alumina, ceria, thoria, zirconia, hafnia, titania, and combinations thereof.

15. A process comprising:

providing a first wafer including a top section and a bottom section and a stiffener disposed against the top section;

providing an intermediate substrate including a first side and a second side and a polymer film disposed on the first side;

applying the polymer film to the stiffener;

treating the polymer film under conditions that cause the polymer to reflow against the stiffener and to outgas;

delaminating the bottom section; and debonding the polymer from the stiffener by a process selected from lateral isotropic etching and wet isotropic etching through back-side access through the intermediate substrate.

16. A process comprising:

providing a first wafer including a top section and a bottom section and a stiffener disposed against the top section;

providing an intermediate substrate including a first side and a second side and a polymer film disposed on the first side;

applying the polymer film to the stiffener;

treating the polymer film under conditions that cause the polymer to reflow against the stiffener and to outgas;

delaminating the bottom section; and debonding the polymer from the stiffener by a process selected from lateral isotropic etching and isotropic etching through back-side access through the intermediate substrate, wherein the etching is selected from a wet etch and a dry etch, and wherein the etch chemistry is selected from a wet eth and an oxygen plasma etch.

* * * * *